Figure 1:
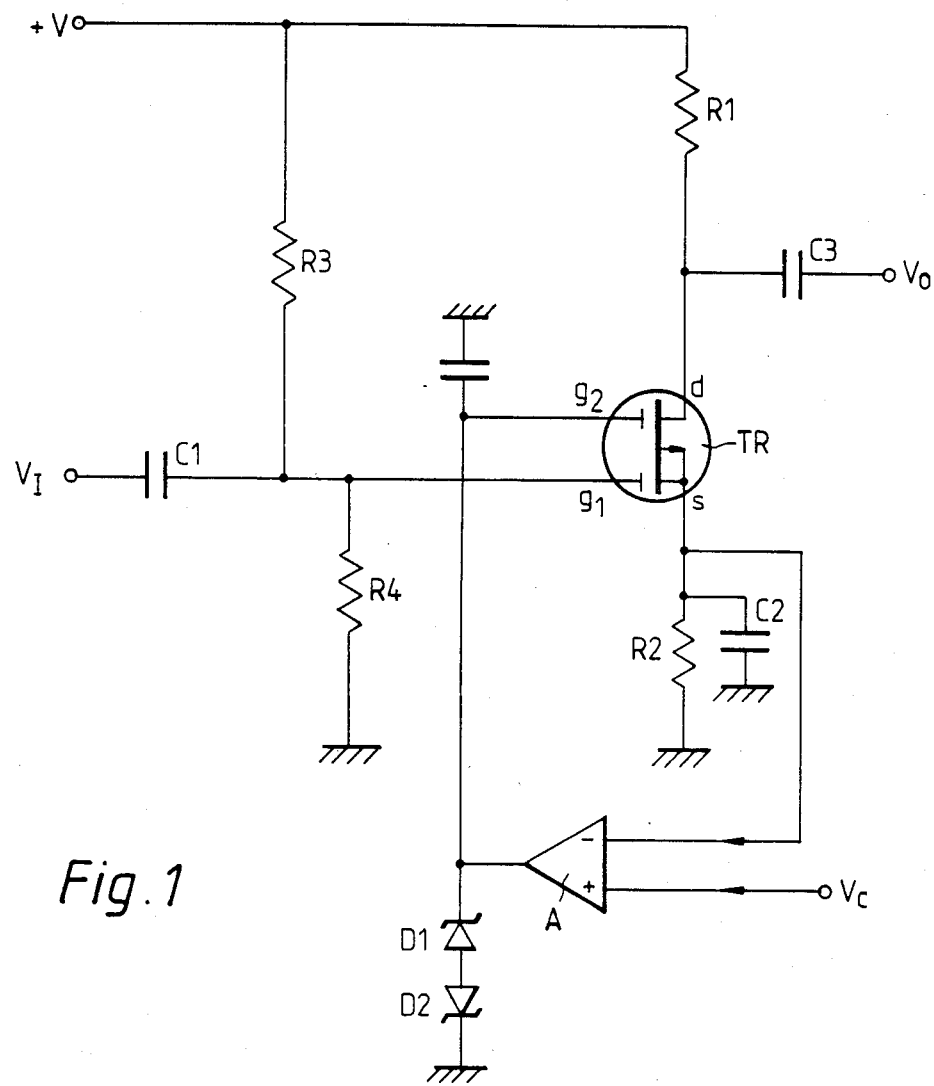

United States Patent [19]

McPherson

[11] Patent Number: 4,578,603
[45] Date of Patent: Mar. 25, 1986

[54] TEMPERATURE-INDEPENDENT GAIN CONTROL CIRCUIT

[75] Inventor: Hugh McPherson, Tweeddale, Scotland

[73] Assignee: Ferranti plc, Cheshire, England

[21] Appl. No.: 478,098

[22] Filed: Mar. 23, 1983

[30] Foreign Application Priority Data

Mar. 31, 1982 [GB] United Kingdom ............... 8209473

[51] Int. Cl.$^4$ ........................................... H03K 3/353
[52] U.S. Cl. ................................... 307/493; 307/501; 307/304; 330/277; 330/279
[58] Field of Search .................... 307/304, 493, 501; 330/277, 278, 279, 282

[56] References Cited

U.S. PATENT DOCUMENTS

| | | | |
|---|---|---|---|
| 3,443,240 | 5/1969 | Santilli | 330/29 |
| 3,480,873 | 11/1969 | Carter | 330/29 |
| 4,077,014 | 2/1978 | Satoh | 330/278 |
| 4,275,361 | 6/1981 | Schurmann | 330/277 |
| 4,465,980 | 8/1984 | Huang et al. | 330/149 |

FOREIGN PATENT DOCUMENTS

| | | |
|---|---|---|
| 1193504 | 6/1970 | United Kingdom . |
| 1234656 | 6/1971 | United Kingdom . |
| 1242858 | 8/1971 | United Kingdom . |
| 1242859 | 8/1971 | United Kingdom . |

*Primary Examiner*—Stanley D. Miller
*Assistant Examiner*—Richard Roseen
*Attorney, Agent, or Firm*—Kerkam, Stowell, Kondracki & Clarke

[57] ABSTRACT

A temperature-independent gain control circuit includes a dual-gate MOSFET having the input signal applied to one gate and a resistance connected to the source. Control means are provided which are responsive to a control voltage to control the voltage between the other gate of the MOSFET and the end of the resistance remote from the source in such a manner as to maintain the drain current of the MOSFET proportional to the control voltage.

2 Claims, 2 Drawing Figures

TEMPERATURE-INDEPENDENT GAIN CONTROL CIRCUIT

This invention relates to gain control circuits of the type which are commonly used in various forms of analogue signal processing circuitry. At low frequencies it is possible to use precision analogue multipliers, which provide linear control and may be designed to have temperature-independent parameters. Such circuits are, however, rather restricted in range of control. At higher frequencies the analogue multiplier is no longer suitable because of this limited range, and also because a logarithmic relationship between gain and control signal amplitude is generally preferred.

One device which is widely used as a gain control element is the dual gate metal-oxide-silicon field-effect transistor, or MOSFET. The signal whose amplitude is to be controlled is applied to the gate nearer to the source, and the control signal is applied to the gate nearer to the drain. These gates are commonly called the "signal" and "control" gates respectively. This device, when suitably biased, provides a wide range of control, is able to handle relatively large input signals, and has excellent isolation between input and output since the control gate is decoupled to earth at the frequency of the signal applied to the signal gate. The relationship between the device transconductance (relative to the signal gate) and the control voltage applied to the control gate is, however, highly dependent on temperature.

It is an object of the invention to provide a temperature-independent gain control circuit using a dual-gate MOSFET, whilst preserving the above-mentioned advantages resulting from the use of this device.

According to the present invention there is provided a temperature-independent gain control circuit which includes a dual-gate MOSFET having the input signal applied to one gate thereof, a resistance connected to the source of the MOSFET, and control means responsive to a control voltage to control the voltage between the other gate of the MOSFET and the end of the resistance remote from the source of the MOSFET in such a manner as to vary the drain current of the MOSFET in proportion to the control voltage.

Figure 2:
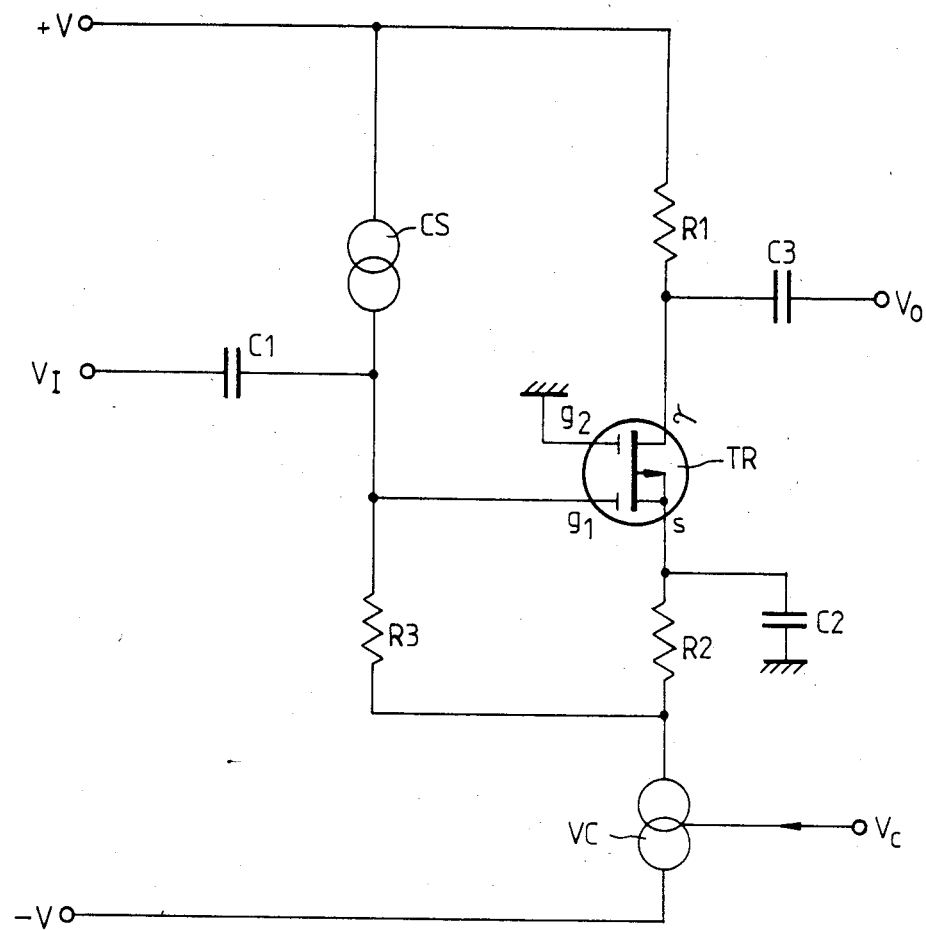

The invention will now be described with reference to the accompanying drawings, in which:

FIG. 1 is a circuit diagram of a gain control circuit according to a first embodiment of the invention; and FIG. 2 is a circuit diagram of a second embodiment.

Referring now to FIG. 1, a dual-gate MOSFET TR has its drain d connected through as resistor R1 to a voltage source +V. The source s of the transistor TR is connected through a resistor R2 to earth. The value of resistor R2 is matched to the transistor to control the characteristic of the circuit, and resistor R2 is decoupled to earth at the signal frequency by capacitor C2. The input signal voltage $V_I$ is applied to signal gate g1 of the transistor TR through a capacitor C1, and the gate is biased at a fixed voltage by means of a resistor R3 connected to the voltage +V and a further resistor R4 connected to earth potential. The output Vo of the circuit is obtained from the drain d of the transistor TR via capacitor C3. The control gate g2 of the transistor TR is connected to the output of an operational amplifier A acting as a differential amplifier and forming the control means of the invention. The control voltage Vc is applied to the non-inverting input of the amplifier, while the inverting input is connected to the source s of the transistor TR. A pair of zener diodes D1 and D2 are connected between the output of amplifier A and earth potential.

It will be seen that the potential divider formed by resistors R3 and R4 fixes the nominal voltage on signal gate g1 of the transistor, and hence the input signal applied to that gate varies about that voltage. The amplifier A acts as a controlled feedback device such that the drain current of the transistor TR is forced to follow the control voltage Vc. This results in a temperature-independent relationship between the applied control voltage Vc and the transconductance of the transistor TR relative to gate g1. It has been found that a linear temperature-independent relationship exists between control voltage Vc and relative gain (in dB) over a wide range of gain and temperature. By way of example only, a gain control circuit of the type shown in FIG. 1 and using a Mullard BFS 28 transistor is linear and stable over a 30 dB gain range and a temperature range from at least −40° C. to +90°.

Amplifier A may have local feedback around it, for example to form an integrator. Networks for shaping the frequency response of the control loop may also be included anywhere in the loop between the source s and the control gate g2. Filter networks may also be included to prevent signals at the input signal frequency from entering the control circuitry.

It may sometimes be necessary to provide means for preventing breakdowns of the transistor if the output voltage of the amplifier should become excessive. By way of example, this may be provided by zener diodes D1 and D2 connected between the amplifier output and earth.

FIG. 2 illustrates a second embodiment of the invention using a different form of control circuit. Referring to FIG. 2, the dual-gate MOSFET TR has its drain d connected to a voltage source +V through a resistor R1, as in the previous embodiment. The source s of the transistor TR is connected through a resistor R2, matched to the transistor as before, and a voltage-controlled current source VC to a voltage supply −V. The current source is one which delivers a current which is proportional to the applied control voltage Vc. Control gate g2 of the transistor TR is connected to earth potential, while signal gate g1 is connected though a constant current source CS to the supply +V. In addition, the gate g1 is connected through a resistor R3 to the junction between the resistor R2 and the controlled current source VC. The signal input voltage $V_I$ is connected through a capacitor C1 to the gate g1 of the transistor TR, while the output voltage Vo is obtained from the drain d of the transistor TR, via capacitor C3. The source s must be decoupled at the frequency of the signal $V_I$ to earth via capacitor C2.

The gain control voltage Vc forms the control input to the variable current source VC.

In operation, a constant current from the source CS flows through the resistor R3, and thus ensures that a constant voltage exists between gate g1 of the transistor TR and the "lower" end of resistor R2 as shown in FIG. 2. Since the control voltage Vc controls the current delivered by the source VC, and part of this current is that constant current provided by source CS through resistor R3, then the drain current of the transistor TR will vary in proportion to the control voltage Vc, and a fixed voltage difference will be maintain across resistor R3. As before, this produces the required temperature-independent relationship between device trans-conductance and control voltage Vc.

The control voltage Vc may be modified by an amplitude-shaping circuit before application to the current source VC, if the shape of the curve relating control voltage Vc and gain (in dB) is required to be changed. The shape of this curve is also affected by the value of resistor R2 and by the potential difference maintained between the signal gate and the "lower" end of resistor R2 as shown in the drawings.

The circuit of FIG. 2 is able to respond to changes in the control voltage Vc considerably faster than could the circuit of FIG. 1, since the operational amplifier and feedback loop are no longer necessary. On the other hand, if speed of response is not so important, the circuit of FIG. 1 is simpler since there is no requirement for temperature-independent current sources.

The two current sources used in the embodiment of FIG. 2 have not been descrived in detail, since the arrangement of such circuits is well known.

Circuits of the type described will operate over a wide frequency range, the lower end of the range being determined by the size of the capacitors and the upper end by the transistor characteristics.

The load resistor R1 may in general be a complex impedance, provided that a d.c. path of suitably low resistance exists through it. For example, a transformer is often used as a load.

What we claim is:

1. A temperature-independent gain control circuit comprising:
    a dual-gate MOSFET having a pair of gates, a source and a drain;
    a signal input connection to one of said MOSFET gates;
    a source resistance having two terminals, one of said source resistance terminals being connected to said MOSFET source such that during operation a voltage drop proportional to drain current is developed across said source resistance; and
    control means responsive to a control voltage for varying MOSFET drain current in proportion to the control voltage by controlling the biasing voltage between said other of said MOSFET gates and said other of said source resistance terminals, while establishing a biasing voltage between the other of said MOSFET gates and the other of said source resistance terminals, said control means including a differential amplifier having:
        an output referenced to said other of said source resistance terminals and connected to said other of said MOSFET gates,
        an input connected to one of said source resistance terminals and responsive during operation to the voltage drop across said source resistance, and
        another input having the control voltage applied thereto.

2. A temperature-independent gain control circuit comprising:
    a dual-gate MOSFET having a pair of gates, a source and a drain;
    a signal input connection to one of said MOSFET gates;
    a source resistance having two terminals, one of said source resistance terminals being connected to said MOSFET source such that during operation a voltage drop proportional to drain current is developed across said source resistance; and
    control means responsive to a control voltage for varying MOSFET drain current in proportion to the control voltage, while establishing a biasing voltage between the other of said MOSFET gates and the other of said source resistance terminals, said control means including a voltage-controlled current source connected to said other of said source resistance terminals for forcing a particular drain current to flow as a function of the control voltage.

* * * * *